United States Patent
You et al.

(10) Patent No.: US 6,200,913 B1
(45) Date of Patent: Mar. 13, 2001

(54) CURE PROCESS FOR MANUFACTURE OF LOW DIELECTRIC CONSTANT INTERLEVEL DIELECTRIC LAYERS

(75) Inventors: Lu You, Santa Clara; Simon S. Chan, Saratoga; John Iacoponi, San Jose; Richard J. Huang; Robin Cheung, both of Cupertino, all of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/191,040

(22) Filed: Nov. 12, 1998

(51) Int. Cl.$^7$ .................................................. H01L 21/324
(52) U.S. Cl. ........................... 438/799; 438/308; 438/522
(58) Field of Search ................................... 438/795, 796, 438/308, 378, 530, 909, 502, 509, 715, 782, 787, 482, 799

(56) References Cited

U.S. PATENT DOCUMENTS

| | | | |
|---|---|---|---|
| 3,980,042 | 9/1976 | Stut | 118/5 |
| 4,817,558 | 4/1989 | Itoh | 118/725 |
| 4,996,080 | 2/1991 | Daraktchiev | 427/57 |
| 5,138,520 | 8/1992 | McMillan et al. | 361/311 |
| 5,587,330 * | 12/1996 | Yamazaki | 438/522 |
| 5,602,060 | 2/1997 | Kobayashi et al. | 437/238 |
| 5,630,881 | 5/1997 | Ogure et al. | 118/730 |
| 5,646,071 | 7/1997 | Lin et al. . | |
| 5,648,282 * | 7/1997 | Yoneda | 438/308 |
| 5,670,210 | 9/1997 | Mandal et al. | 427/240 |
| 5,707,900 * | 1/1998 | Sano et al. | 438/509 |
| 5,840,821 | 11/1998 | Nakano et al. | 528/10 |
| 5,874,128 | 2/1999 | Kim | 427/240 |
| 5,883,001 | 3/1999 | Jin et al. | 438/624 |
| 5,925,410 | 7/1999 | Akram et al. | 427/240 |
| 5,939,130 | 8/1999 | Shiraishi et al. | 427/9 |
| 5,942,035 | 8/1999 | Hasebe et al. | 118/52 |
| 5,962,085 | 10/1999 | Hayashi et al. | 427/585 |
| 5,985,363 | 11/1999 | Shiau et al. | 427/240 |
| 5,985,364 | 11/1999 | Smith et al. | 427/240 |
| 5,989,632 | 11/1999 | Sanada et al. | 427/240 |
| 6,004,622 | 12/1999 | Yen et al. | 427/240 |
| 6,015,457 | 1/2000 | Leung et al. | 106/287.16 |
| 6,017,806 * | 1/2000 | Harvey | 438/475 |

OTHER PUBLICATIONS

Giannelis, et al., "Spin–On Films Add new Dimension to ULSI Circuits," *Circuits & Devices, IEEE*, Nov. 1993, pp. 30–34.

(List continued on next page.)

*Primary Examiner*—David Nelms
*Assistant Examiner*—Dung A Le
(74) *Attorney, Agent, or Firm*—Fliesler, Dubb, Meyer & Lovejoy

(57) ABSTRACT

This invention comprises improvements in the ways in which spin-on dielectric layers are cured. A semiconductor wafer is coated with a precursor for a spin-on dielectric material, and after the solution is thinned and evened, the wafer is placed in a curing oven, optionally containing an inert gas, and pre-heated to a temperature below which excessive thermomechanical stresses and/or oxidation are not created in the semiconductor wafer. The temperature within the curing oven is then raised to a curing temperature, and thereafter the temperature is slowly lowered to prevent the formation of stress cracks and the loss of dielectric function of the thin film. The curing method of this invention is useful for the manufacture of semiconductor devices employing a variety of spin-on materials.

22 Claims, 4 Drawing Sheets

OTHER PUBLICATIONS

Wang, "Sign–On Dielectric Films—A General Overview," Solid State and Integrated Circuit Technology, 1998, Proceedings, 1998 5th International Conference. IEEE/EE Electronic Library Online, Abstract, p. 961.

Wolf, Ph.D., et al., "Silicon Processing for the VLSI Era, Vol. 1: Process Technology," *Lattice Press*, pp. 265–266, 430–434.

Jacobson, D., et al., "Recommendation for Priming a Filter in a Wafergard Gen–2 Pump," *Microelectronics Division, Millipore Corporation*, Oct. 12, 1994, pp. 1, 3, and 5.

Bowers, William, et al., "Design, Performance Validation, and Reliability Testing of a New Photochemical Dispense Pump," *Millipore Corporation and Silicon Valley Group, Inc.*

"Wafergard® Gen–2 Photochemical Dispense System," Data Sheet, *Millipore*.

"Wafergard® Gen–$2^{Plus}$ Photochemical Dispense System," Data Sheet, *Millipore*.

Treichel, et al., "Low Dielectric Constant Materials for Interlayer Dielectric," Dumic Conference, Feb. 16–17, 1998, 1998 IMIC—333D/98/0201, pp. 1–10.

* cited by examiner

CURE PROCESS FOR MANUFACTURE OF LOW DIELECTRIC CONSTANT INTERLEVEL DIELECTRIC LAYERS

CROSS-REFERENCE TO RELATED APPLICATIONS

U.S. patent application Ser. No. 09/190,721 entitled: "Closed Deposition Apparatus and Methods for Regulating Drying of Spin-On Films." Inventors: Lu You, Dawn Hopper, Richard J. Huang. Filed: Nov. 12, 1998

U.S. patent application Ser. No. 09/191,438 entitled: "Apparatus and Methods for Uniform Scan Dispensing of Spin-On Films." Inventors: Lu You, Dawn Hopper, Christof Streck, John Pellerin, Richard J. Huang. Filed: Nov. 12, 1998.

U.S. patent application Ser. No. 09/191,101 entitled: "Rapid Acceleration Methods for Global Planarization of Spin-On Films." Inventors: Lu You, Dawn Hopper, Richard J. Huang. Filed: Nov. 12, 1998.

U.S. patent application Ser. No. 09/191,433 entitled: "Solution Flow-In for Uniform Deposition of Spin-On Films." Inventors; Lu You, Dawn Hopper, Richard J. Huang. Filed: Nov. 12, 1998.

U.S. patent application Ser. No. 09/190,722 entitled: "Methods of Manufacture of Uniform Spin-On Films." Inventors: Lu You, Dawn Hopper, Richard J. Huang. Filed: Nov. 12, 1998.

U.S. patent application Ser. No. 09/191,430 entitled: Semiconductor Devices Having Spin-On Thin Films With Global and Local Planarity. Inventors: Lu You, Dawn Hopper, Richard J. Huang. Filed: Nov. 12, 1998.

All of the above-identified patent applications are herein incorporated fully by reference.

BACKGROUND OF THE INVENTION

1. Field of the Invention

The present invention relates to the field of semiconductor manufacturing. Specifically, the invention relates to improved methods for curing semiconductor thin films, and more specifically, the invention relates to methods for regulating the temperature and temperature changes to which semiconductor thin films are exposed during the curing process. The invention also relates to semiconductor products made using the curing processes.

2. Discussion of the Related Art

Interlayer dielectric layers comprise insulating materials whose purpose is to electrically separate conductive elements of integrated circuits. One property of dielectric materials is the dielectric constant. For certain purposes it is desirable to use materials with low dielectric constants. The manufacture of interlayer dielectric semiconductor thin films is typically carried out by first depositing the desired thin film on a semiconductor substrate. One common way of depositing thin films is by spin-on deposition. During spin-on deposition, a solution of precursor for the thin film is applied to a semiconductor wafer, and thereafter, the wafer is rotated at sufficiently high speed (rapid spinning step) to thin and even the layer of precursor solution. After the rapid spinning step, the solvents are permitted to evaporate, leaving a dried film of dielectric material. However, typically, some of the commonly used dielectric materials require subsequent processing, including curing the thin film at high temperature. The high temperature curing step can cross-link the precursor molecules together, making a tighter, stronger film with a low dielectric constant.

Unfortunately, the currently available methods for curing spin-on deposition films are inadequate for producing high-quality thin films. In one example of a prior art method, after a precursor solution is allowed to dry on a semiconductor wafer, the wafer is typically placed in a pre-heated oven or furnace to cure the thin film. $SiO_2$—like films are typically cured at a temperature of about 400° C. The wafer is maintained at that high temperature for about one hour, and is then removed from the curing oven. Such treatments have disadvantages. If the wafer is placed into an oven pre-heated to a temperature that is too high, the thin film is subjected to high thermal/mechanical stress, and can crack, becoming weak and having an undesirably low dielectric strength and mechanical strength. Similarly, if the wafer is abruptly removed from the heated oven, the rate of cooling can be too high, causing high thermal/mechanical stresses, which degrade the performance of the film. Moreover, in the manufacture of multilayered films, with several levels of semiconductor features, the repeated heating and cooling of the underlying layers can cause progressively greater defects in the films.

Therefore, methods are needed which result in the rapid, efficient curing of spin-on thin films, while maintaining the desired low dielectric constant, high dielectric efficiency, and high mechanical strength.

SUMMARY OF THE INVENTION

Therefore, one object of this invention is the development of new methods for rapidly curing spin-on thin films for semiconductor manufacture.

Another object of this invention is the manufacture of spin-on dielectric thin films with improved dielectric properties.

A further object of this invention is the manufacture of spin-on dielectric thin films with improved mechanical strength.

Thus, the invention comprises new methods for heating and cooling semiconductor thin films, wherein the semiconductor with a solution of dielectric precursor is placed in a curing oven at a temperature above room temperature and the temperature is raised or "ramped up" at a predetermined rate to a maximum temperature, maintained at that maximum temperature for a period of time, and then cooled at a predetermined rate "ramped down" to a temperature sufficiently low to permit the wafer to be removed from the oven and exposed to ambient temperature conditions without the creation of undue mechanical stress.

One aspect of this invention is apparatus to cure semiconductor wafers, comprising a heating oven, and heating elements controlled by a processor to provide a predetermined temperature and rate of heating, maximum temperature, and the rate of cooling.

Another aspect of this invention is a method for increasing the temperature in a curing oven, whereby the rate of heating is regulated to minimize the thermomechanical stress to which the wafer thin films is subjected to during curing.

Another aspect of the invention is the curing of a semiconductor thin film beginning at a temperature sufficiently high to minimize the total curing time required, while minimizing the thermomechanical stresses to which the wafer is subjected.

Yet another aspect of the invention is the regulation of the rate of wafer cooling, whereby the thermomechanical stresses are minimized, while minimizing the total time taken to cure semiconductor wafers.

An additional aspect of this invention is the minimization of oxidation of the dielectric film by the use of inert gases in the curing oven to obtain desirable electrical properties.

Figure 1:
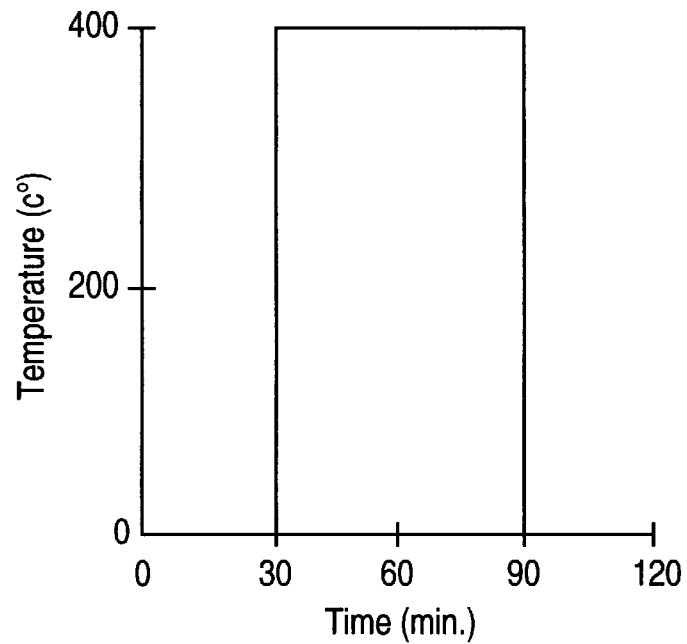
FIG. 1 is graph of temperature versus time of an embodiment of a prior art curing method in which the wafer is cured in a pre-heated oven.

The Figures are more fully explained in the Detailed Description of the Invention.

DETAILED DESCRIPTION

This invention solves the problems of the prior art curing methods by providing rapid curing while minimizing the thermomechanical stresses to which semiconductor thin films are subjected. The decreased stresses result in lower dielectric constant, higher dielectric strength, and increased mechanical strength.

The invention typically comprises placing a semiconductor wafer in a pre-heated curing oven, optionally in an inert gas environment, thereafter ramping up the temperature inside the oven to a maximum temperature for curing the specific film, holding the temperature at a pre-determined level for a period of time, and then ramping down the temperature at a predetermined rate until a temperature sufficiently low is achieved to permit the removal of the semiconductor wafer from the oven without subjecting the wafer to undesirably large thermomechanical stresses or oxidation. The invention also comprises regulating the rate of oxidation by the use of an inert gas in the curing oven.

I. Low Dielectric Constant Semiconductor Materials.

Silicon dioxide films can typically deposited using spin-on methods. Deposition of $SiO_2$—like spin-on films is described in co-pending patent applications; You et al., Closed Deposition Apparatus and Methods for Regulating Drying of Spin-On Films. You et al., Apparatus and Methods for Uniform Scan Dispensing of Spin-On Materials. You et al., Rapid Acceleration Methods for Global Planarization of Spin-On Films. You et al., Solution Flow-In for Uniform Deposition of Spin-On Films. You et al., Methods of Manufacture of Uniform Spin-On Films. and You et al., Semiconductor Devices Having Spin-On Thin Films With Global and Local Planarity. These co-pending applications are incorporated herein fully by reference.

Several different precursors for low dielectric constant films are known in the art. One example of a precursor for deposition of $SiO_2$ films is hydrogen silsesquioxane (HSQ). The deposition of HSQ films from a solution can result in the deposition of a film comprising monomers of $SiO_3H$ and $SiO_4$. Typically, a thin film made from HSQ can contain about 25% $SiO_3H$ and about 75% $SiO_4$, although other proportions of $SiO_3H$ and $SiO_4$ can be present. Films comprised of $SiO_3H$ have a lower dielectric constant than films made of pure $SiO_4$.

II. Curing Semiconductor Thin Films.

Curing HSQ films at elevated temperatures using prior art methods can result in substantial oxidation of the $SiO_3H$ monomer to $SiO_4$ monomers. Upon heating, the SiOH groups can give up $H^+$ ions and can absorb $H_2O$. The $H^+$ ions can decrease the useful lifetimes of the semiconductor devices, and the increase in $H_2O$ can result in the increase in dielectric constant. When oxidized and then polymerized to form cross-linked silicon dioxide films, the thin film with absorbed $H_2O$ exhibits an undesirably high dielectric constant, often in the range of about 3.6 to about 3.7. Dielectric constants in this range are too high to be useful in the manufacture of advanced semiconductors with feature sizes below about 0.35 $\mu$m. Thus, it is desirable to prevent the oxidation of $SiO_3H$.

By reducing the total time during which spin-on films are exposed to high temperatures and by regulating the flow of an inert bas into the curing oven, the oxidation of $SiO_3H$ to $SiO_4$ is minimized, so that upon cooling and polymerization, the film retains many of the original OH groups and therefore can absorb less water. Moreover, by regulating the rate of heating and cooling the substrate after deposition, the dielectric constant of the film and the composition of the film can be regulated. Therefore, the dielectric constant of the resulting film can be maintained in the desirable range of about 2.9 and below.

A. Regulation of Heating and Cooling.

FIG. 1 is a graph of temperature versus time for a prior art method for curing silica thin films. The wafer is placed in the curing oven pre-heated to a temperature of about 400° C. The temperature is maintained at the maximum temperature for a period of about 1 hour, and is then the wafer is removed from the curing oven and permitted to cool in air. After removing the wafer from the curing oven the wafer temperature drops rapidly to room temperature. This "step change" method has the advantage of decreasing the time required for curing dielectric thin films compared to other methods and thus, permits higher through-put, decreased manufacturing time, and decreased cost. However, the rapid heating and cooling can create thermomechanical stresses on the thin film, thereby decreasing the dielectrical constant and deceasing the useful lifetime of the semiconductor device. Additionally, cooling in air causes undesirable oxidation of the thin film, thereby increasing the dielectric constant of the film.

Figure 2:
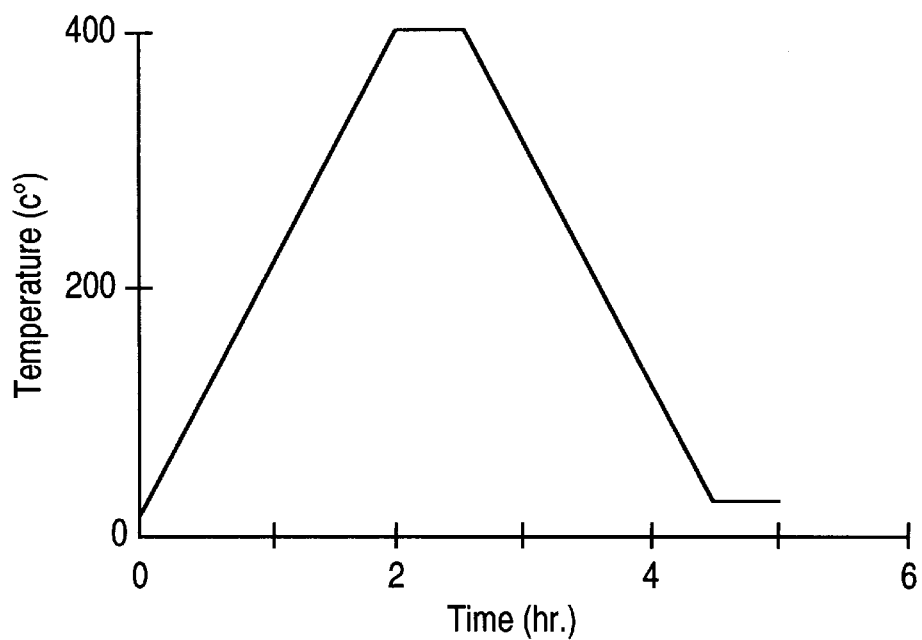
FIG. 2 is a graph of temperature versus time of an embodiment of the invention where the temperature is controllably increased to a maximum temperature and is then controllably decreased.

FIG. 2 is a graph of temperature versus time for an embodiment of the invention. After the deposition of a film deposited by spin-on or other methods, the wafer is introduced into the curing oven at room temperature, optionally containing an inert gas to decrease oxidation of the film, and the temperature is slowly ramped up at a rate of about 3° C./min to a maximum temperature of about 400° C. The wafer is maintained at that temperature for periods of from about 15 minutes to about 1 hour or more, and thereafter the temperature is slowly ramped down, at a rate of about 3° C./min to room temperature. In one mode of the invention, the oven contains an inert gas during the entire heating and cooling processes. The wafer is then removed from the oven. As can be seen the total time required to carry out this curing process is over 5 hours. This method decreases the thermo-mechanical stresses on the film, and therefore the dielectric constant is not increased as with the prior art methods. Furthermore, when an inert gas is used, the dielectric constant of the film is reduced further. However, the long time required to cure the thin film decreases the through put and increases the cost of manufacturing semiconductor devices.

1. Initial Curing Temperature

To cure spin-on thin films according to one embodiment of the invention, pre-heating the curing oven produces films with reduced oxidation of the thin film. Typically, the temperature of the pre-heated oven is above room temperature and below about 350° C. or below. After placing the wafer in the pre-heated oven, the temperature in the oven is raised in a controlled fashion to the maximum curing temperature of about 400° C., and the temperature is controllably cooled. Similarly, by pre-heating the curing oven to a temperature at about 300° C. or below, and then raising the temperature in a controlled fashion to the maximum curing temperature, and then controllably cooling the substrate, one produces films with low dielectric constant and improved mechanical properties. Thus, the initial temperature is in the range of about 225° C. to about 350° C., alternatively between about 275° C. to about 325° C., and in another example, about 350° C.

2. Regulating Heating Rates.

Furthermore, by controllably ramping up the temperature of the oven at a predetermined rate, the desirable characteristics of low dielectric constant and high mechanical strength can be achieved. It is desirable to begin increasing the temperature immediately after placing the wafer in the pre-heated oven optionally containing an inert gas. Generally, the rate of temperature rise or ramp up rate should be slow enough to prevent significant oxidation of and the build up of mechanical stress in the thin film. The maximum permissible rate of temperature increase varies with the type of semiconductor dielectric materials used. For HSQ, the rates of temperature increase are typically in the range of about 1° C./min to about 10° C./min, alternatively in the range of about 2° C./min to about 5° C./min, and in another example, about 3° C./min. We have found that if the rate of temperature increase is too high, the film can crack. For rates of heating of from about 1° C./min to about 3° C./min, the dielectric constant is approximately constant at about 2.9. However, as the rate of heating increases above about 5° C., the dielectric constant of the resulting film increases.

Figure 3:
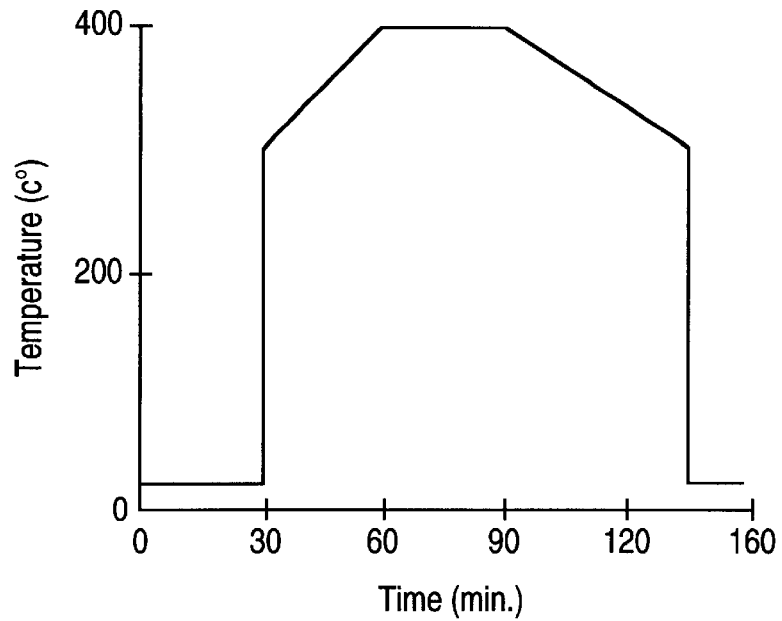
FIG. 3 is a graph of temperature versus time of another embodiment of the invention wherein the semiconductor wafer is placed in an oven pre-heated to a temperature less than that for FIG. 1, and the rates of heating and cooling are regulated.

FIG. 3 is a graph of temperature versus time for an embodiment of the invention. After depositing a film of low dielectric material such as HSQ on a wafer, the wafer is placed in an oven pre-heated to a temperature of about 300° C. optionally containing an inert gas. The wafer temperature is ramped up for about 30 minutes at a rate of about 3° C./min to a maximum temperature of about 400° C., and is maintained at that temperature for about 60 minutes, after which time, the temperature is ramped down over about 40 minutes at a rate of about 2.5° C./min until a temperature of about 300° C. is reached. The wafer is then removed from the curing oven and permitted to cool to room temperature. The total time taken for this embodiment of the invention is about 2 hours, compared with a total time of over 5 hours for the embodiment of the invention described in FIG. 2. A preferred method of this invention has the advantage over the other embodiment described in that the rates of heating and cooling are more compatible with preservation of low dielectric constant and high mechanical strength. Furthermore, a preferred method including an inert gas wafer environment has the advantage over the "step-change" method in that because the wafer is exposed initially to a temperature which does not cause undue thermomechanical stress and reduces the oxidation of the thin film. Additionally, because the temperature is increased more slowly to the maximum curing temperature than in the prior art, and because of the heating in an environment containing inert gas, the wafer can be subjected to the same maximum curing temperature without the drawbacks of decreased electrical performance and short lifetime, as are characteristic of prior art methods. Finally, by controllably cooling the substrate after curing, again, optionally in an inert gas environment, the thermomechanical stress and oxidation of the thin film are minimized, resulting in a thin film with a low dielectric constant.

3. Regulating the Time at Maximum Temperature

After the temperature in the curing oven has reached the maximum, typically in the range of about 375° C. to about 500° C., alternatively about 400° C. to about 450° C., and in another example about 400° C., the wafer temperature is maintained for sufficiently long period of time for cross-linking to become substantially complete. Typically, for HSQ films, this period is in the range of about 15 min to about 90 min., alternatively in the range of about 20 min to about 75 min., and in another example, about 30 min. These time periods can be adjusted depending on the type of dielectric material used. In general, the longer the time period at maximum temperature, the more cross-linking can occur. However, with prolonged exposure to high temperatures, the dielectric material can oxidize and lose some of its desired low dielectric constant properties. By using the relatively slow rate of temperature increase and decrease, a portion of the curing process can occur at temperatures below the maximum temperature. Thus, the time required at the maximum temperature can be reduced while providing sufficient curing. The temperature can be maintained at the maximum for a period of about 15 minutes to about 30 minutes, while maintaining the temperature above about 350° C. for a total period of about 1 hour. Thus the total time required for curing the thin film can be kept relatively low (about 1½ hrs).

4. Regulating Rates of Cooling

Figure 4:
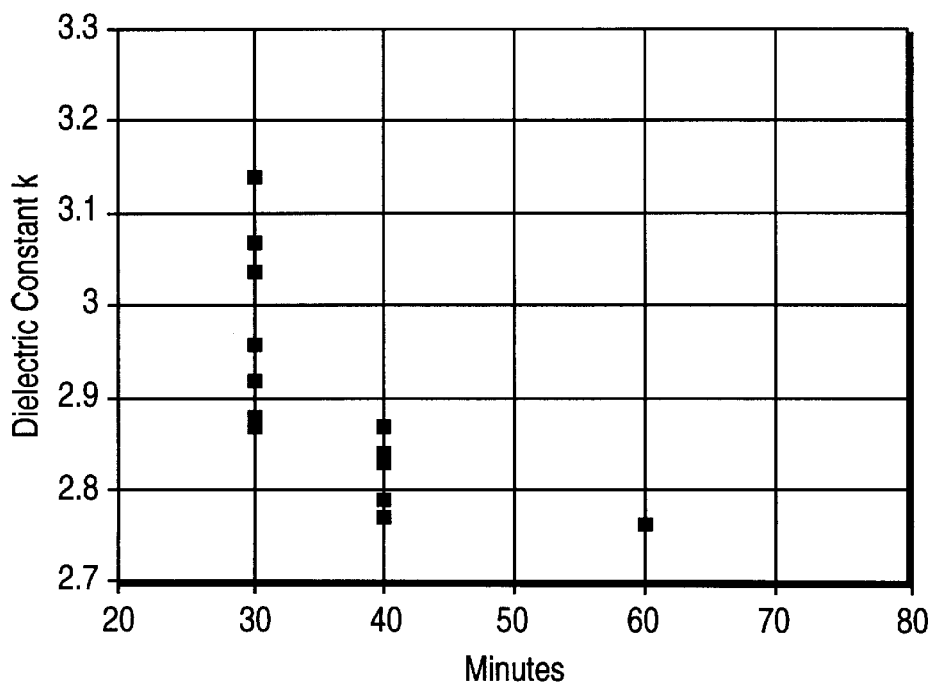
FIG. 4 is a graph of dielectric constant (K) of a semiconductor thin film as a function of the time of temperature decrease during cooling.

In addition, by controlling the rate of cooling, the properties of the cured film can be improved while minimizing curing times. After the maximum temperature curing phase, the temperature in the oven is ramped down to the initial pre-heat temperature. Generally, the rates of temperature decrease are typically in the range of about 1° C./min to about 10° C./min, alternatively in the range of about 2° C./min to about 7.5° C./min, and in another example, below about 5° C./min. and in yet another example, about 2.5° C./min. Thus, it is advantageous to select a ramp down rate to minimize K and maximize manufacturing through-put. The dielectric constant is advantageously in the range of about 2.9 to about 3.5, alternatively below about 3.0, and in another example, below about 2.9. By way of example only, FIG. 4 shows a graph of the relationship between cooling time from 400° C. to 300° C. and the dielectric constant (K) of the resulting film. When cooled at a rate of 3.3° C./min (time of cooling=30 min), the K of the resulting film is somewhat variable, with an average of about 2.9. When the rate of cooling is lowered to 2.5° C./min. (time of cooling= 40 min), the K decreases to just over about 2.8. Finally, if the rate of cooling is 1.6° C./min. (time of cooling=60 min), the K of the resulting film is less than about 2.8.

Figure 5:
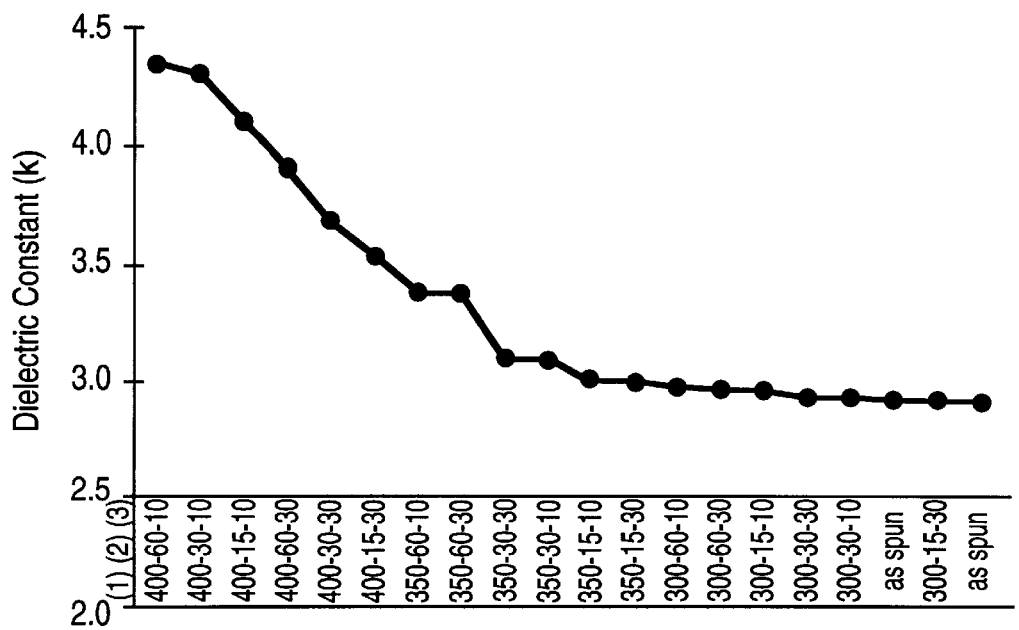
FIG. 5 is a graph of dielectric constant (K) of a semiconductor thin film as a function of (1) the starting temperature of a curing oven, (2) the total time of curing at the maximum temperature, and (3) the nitrogen flow rate.

B. Regulation of Gas Composition During Curing $SiO_3H$ can oxidize to $SiO_4$, which increases K. To minimize the dielectric constant, it is therefore desirable to manufacture films in such a fashion as to minimize the loss of SiH. Curing semiconductor dielectric thin films in an atmosphere of an inert gas results in reduced oxidation of the thin film material. The inert gas can introduced at the heating step, the maximum temperature curing step, and/or the cooling steps. Suitable gases include the noble gases, helium, neon, argon, krypton, and xenon, as well as nitrogen. Moreover, any other non-oxidizing gas which does not cause contamination of the wafer can be used. Nitrogen is an attractive alternative because of its low cost. Although nitrogen or other inert gas does not prevent the release of $H^+$ ions into the thin film, with the curing methods of this invention, the total amount of $H^+$ ions released is reduced. By way of example only, FIG. 5 shows that under conditions of higher initial curing temperature, increasing nitrogen flow rate can decrease K. However, the decrease in K is not as great as the decrease in K made possible by curing substrates with initially low temperatures.

The flow rates of the inert gas are generally in the range of about 5 standard liters per minute (slpm) to about 50 slpm, alternatively between about 10 slpm and about 30 slpm, and in another example, between about 20 slpm and about 30 slpm.

C. Combined Effects of Initial Temperature, Heating Rate and Inert Gas Flow.

By selecting the initial temperature, heating rate, cooling rate, and inert gas flow, the physical and electrical properties of the thin films can be optimized. If the initial temperature of the curing oven is too high, the dielectric constant of the film increases to undesirably high values.

Decreasing the initial temperature to 350° C. increases the amount of retained SiH in the film to about 95%. Decreasing the total time at maximum temperature or increasing the nitrogen flow rate have little effect on the already high retention of original SiH. Further decreasing the initial temperature to 300° C., or alteration in time at maximum temperature or nitrogen flow rate did not further affect the retention of original SiH. It is suitable for the amount of SiH retained in the film to be in the range of about 75% to about 100%, alternatively in the range of about 80% to about 100%, in another example above about 90%, in yet another example from about 95% to about 100%, and in an additional example, about 100%.

By way of example only, FIG. 5 is a graph of the dielectric constant (K) as a function of the curing conditions. The descriptors indicated on the horizontal axis are (1) the initial temperature in C°, (2) the time at 400° C., and (3) the flow rate in standard liters per minute (slpm) of nitrogen gas into the curing oven. For a substrate placed in an oven preheated to 400° C., with a time at the maximum temperature is 60 minutes, and with the nitrogen flow rate of 10 slpm, the K of the resulting cured film is about 4.4. Decreasing the time at the maximum temperature and/or increasing nitrogen flow rate each decrease K, and decreasing initial temperature and increasing nitrogen flow together further decreases K. Moreover, decreasing the initial temperature to 350° C. unexpectedly decreases K to about 3.3. Further decreasing the initial temperature to 300° C. can decrease K even further to less than about 3.0, and even to about 2.9. However, at an initial temperature of 300° C., decreasing the time at maximum temperature and/or increasing nitrogen flow do not decrease K below about 2.9. Treating substrates in this fashion results in thin films with minimal K, being nearly the same as the K for uncured films (as-spun).

Alternatively, if the initial temperature of the curing oven is too close to room temperature, the total time taken to cure the thin films increases to undesirably large times, as the case for the embodiment described in FIG. 2. This long time of elevated temperatures decreases the mechanical strength and increases dielectric constant. Therefore, in this invention, the initial temperature of the curing oven is set in the range of about 225° C. to abut 350° C., alternatively in the range of about 275° C. to about 325° C., and in another example at about 300° C. By selecting a temperature within these ranges, the process does not result in the thin films being subjected to harmful thermomechanical stresses. The reduced rates of temperature increase also results in a reduction of the time necessary at the maximum temperature. Thus, with slow heating, the time of curing at the maximum temperature can be reduced below the 1 hour typically needed using the alternative methods.

Figure 6:
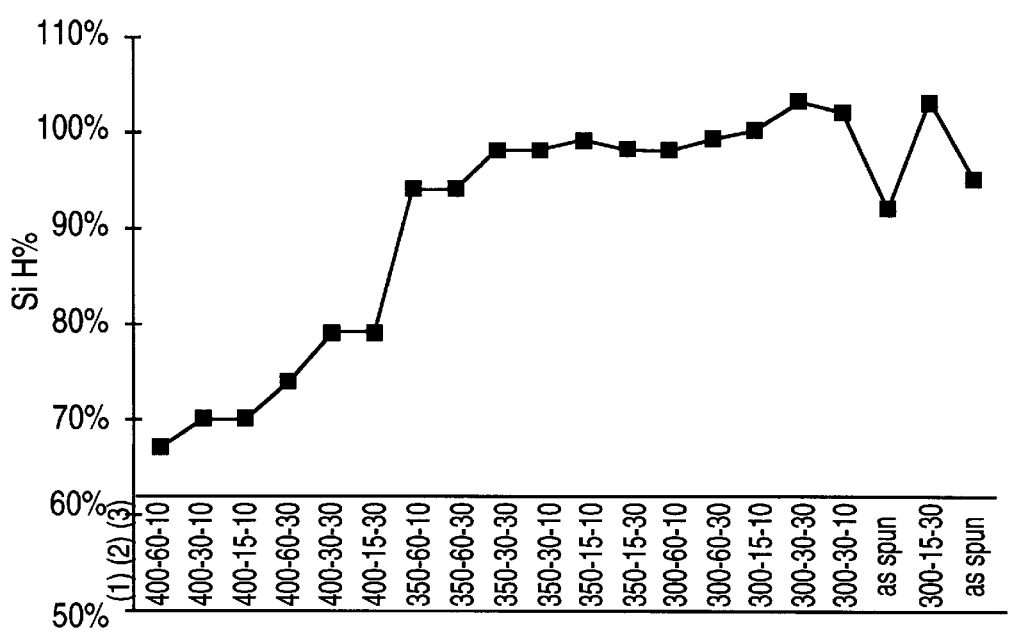
FIG. 6 is a graph showing the percent SiH (%) present in films cured according to this invention as a function of (1) the starting temperature of a curing oven, (2) the total time of curing at the maximum temperature, and (3) the nitrogen flow rate.

In addition to the dielectric constant being sensitive to curing conditions, the chemical composition of the thin film is also sensitive to the same curing conditions. By way of example only, FIG. 6 shows the relationship between curing variables and the percent of SiH in the resulting thin film. The descriptors on the horizontal axis are (1) the initial temperature, (2) the time at the maximum temperature of 400° C., and (3) the flow rate of nitrogen in slpm. At an initial temperature of 400° C., with 60 minutes at maximum temperature and with 10 slpm nitrogen flow rate, the thin film loses about 35% of the initial SiH. Decreasing the time at maximum temperature has a minimal effect, whereas increasing the nitrogen flow rate permits the retention of the original SiH by about 80%.

The methods of this invention can be practiced on any type of dielectric material having $SiO_2$ and $SiO_3H$. However, the instant invention is advantageously practiced using films deposited by spin-on methods as described in the co-pending applications cited above.

III. Properties of Semiconductor Thin Films Cured Using Methods of the Invention.

Chemical properties of thin films cured using the methods of this invention are more desirable compared to films cured using prior art methods. One theory to account for this is that before polymerization of the precursors, the thermomechanical stress is mostly confined to the underlying semiconductor substrate. However, after polymerization of the thin film dielectric layer, its mechanical strength has increased, and thus, thermomechanical stresses increase as the rates of temperature change are increased. Thus, by reducing the rates of temperature change, the thermomechanical stresses are reduced. Moreover, curing in an environment containing an inert gas may improve film quality by reducing the oxidation of the film and/or by decreasing the amount of water which can be absorbed by the film during curing. Although this is one theory to account for the observations, the invention is not limited to any particular theory of operability. Other theories may account for the observations, and all are considered to be part of the invention.

By performing the curing process in this fashion, the time taken to cure the dielectric film is balanced against the introduction of thermomechanical stresses on the film. By optimizing the temperature and time variables in this way, high quality spin-on films can be manufactured with a minimum time required for their manufacture.

IV. Curing Multilayered Dielectric Films.

The curing methods of the present invention can be practiced using more than a single layer of dielectric material. However, if multiple layers are cured, the dielectric properties of underlying layers may become compromised as the total duration of their exposure to elevated temperatures increases as successive overlaying layers are cured. However, the degradation of dielectric film quality for underlaying layers is not as severe as for surface layers because the underlaying layers are not exposed to atmospheric water during the dispensation of the precursor solutions and are not exposed to oxygen during curing or other processing steps. As more layers are added to the semiconductor device, the protection of underlying layers increases. Thus, the methods of this invention are well suited for applications involving deposition of multiple layers of dielectric materials.

V. Manufacture of Semiconductor Devices Using Methods of This Invention.

Figure 7A:
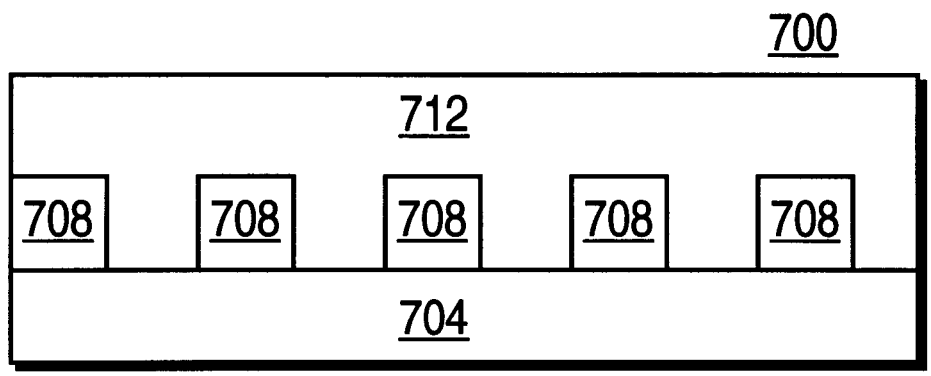
FIGS. 7a and 7b are depictions of semiconductor devices comprising the curing methods of this invention.
Figure 7B:
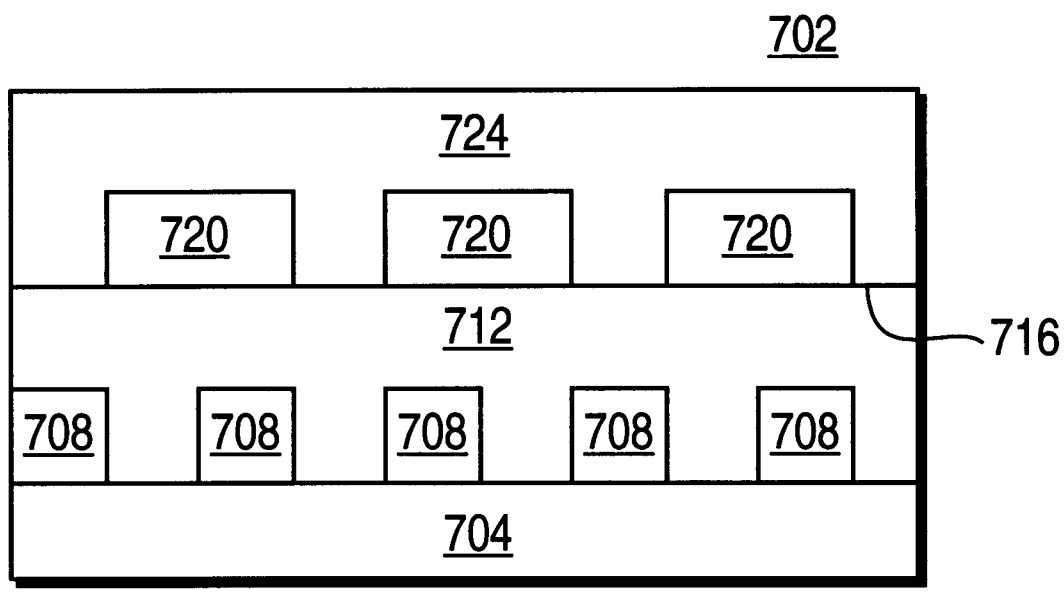

FIGS. 7a and 7b are depictions of semiconductor devices with dielectric films cured by the methods of this invention. FIG. 7a depicts a semiconductor device 700 comprising a substrate of Si 704 with metal lines 708 deposited thereon, and a layer of dielectric material 712 deposited in the gaps between, and over the top of metal lines 708, and cured using the methods of this invention.

FIG. 7b depicts a multilayered semiconductor device 702 comprised of a Si substrate 704 with a first layer of metal lines 708 deposited thereon, and a first interlayer dielectric layer of low dielectric material 712 deposited and cured according to the methods of this invention. After curing, the surface 716 of the first dielectric layer 712 was planarized using chemical mechanical polishing. A second layer of metal lines 720 was deposited on the planarized surface 716 of the first interlayer dielectric layer. A second interlayer dielectric material 724 was deposited in the gaps and on the tops of the second layer of metal lines 720.

While the present invention has been described with reference to its alternative embodiments, those embodiments are offered by way of example, not by way of limitation. Those of ordinary skill in the art will be enabled by this disclosure to add to or modify the embodiments of the present invention in various obvious ways. Accordingly, such modifications and additions are deemed to lie within the spirit and scope of the invention as set out in the appended claims.

INDUSTRLIAL APPLICABILITY

The curing method descried is useful in the manufacture of semiconductor devices employing spin-on interlayer dielectric materials. The methods of the invention produce high quality thin films with low dielectric constant, high dielectric strength, high mechanical strength and high resistance to cracking. Moreover, the methods of this invention decrease the time required to cure dielectric films, thereby increasing the throughput and decreasing the cost of manufacturing semiconductor devices.

What is claimed is:

1. A method for curing a dielectric film on a semiconductor wafer, comprising the steps of:

providing a semiconductor wafer with a dielectric layer thereon;

placing said semiconductor wafer in an curing oven at a first temperature in the range of about 225° C. to about 350° C., ramping up the temperature within said curing oven to a second temperature;

maintaining the temperature within said curing oven at the second temperature for a period of time;

ramping down the temperature within said curing oven to a third temperature; and removing said wafer from said oven.

2. The method of claim 1, further comprising providing a flow of an inert gas into said curing oven.

3. The method of claim 1, wherein said step of ramping is carried out at a rate in the range of about 1° C./min to about 10° C./min.

4. The method of claim 1, wherein said second temperature is in the range of about 375° C. to about 500° C.

5. The method of claim 1, wherein said period of time is in the range of about 15 minutes to about 90 minutes.

6. The method of claim 1, wherein said step of decreasing is carried out at a rate in the range of about 1° C./min. and about 10° C./min.

7. The method of claim 2, wherein said inert gas is selected from the group consisting of nitrogen, helium, neon, argon and xenon.

8. The method of claim 2, wherein the flow rate of said inert gas is between about 5 standard liters per minute (slpm) and about 50 slpm.

9. The method of claim 1, wherein the percent of SiH retained in the thin film is above about 75%.

10. The method of claim 1, wherein the dielectric constant of the film is less than about 3.3.

11. A method for curing a dielectric film on a semiconductor wafer, comprising the steps of:

providing a semiconductor wafer with a dielectric layer thereon;

placing said semiconductor wafer in an curing oven at a first temperature of about 300° C., ramping up the temperature within said curing oven to a second temperature;

maintaining the temperature within said curing oven at the second temperature for a period of time;

ramping down the temperature within said curing oven to a third temperature; and removing said wafer from said oven.

12. A method for curing a dielectric film on a semiconductor wafer, comprising the steps of:

providing a semiconductor wafer with a dielectric layer thereon;

placing said semiconductor wafer in an curing oven at a first temperature;

providing a flow of an inert gas into said curing oven at a flow rate between about 5 standard liters per minute (slpm) and about 50 slpm;

ramping up the temperature within said curing oven to a second temperature;

maintaining the temperature within said curing oven at the second temperature for a period of time;

ramping down the temperature within said curing oven to a third temperature; and removing said wafer from said oven.

13. The method of claim 12, wherein said step of ramping is carried out at a rate in the range of about 1° C./min to about 10° C./min.

14. The method of claim 12, wherein said second temperature is in the range of about 375° C. to about 500° C.

15. The method of claim 12, wherein said period of time is in the range of about 15 minutes to about 90 minutes.

16. The method of claim 12, wherein said step of decreasing is carried out at a rate in the range of about 1° C./min. and about 10° C./min.

17. The method of claim 12, wherein the percent of SiH retained in the thin film is above about 75%.

18. The method of claim 12, wherein the dielectric constant of the film is less than about 3.3.

19. A method for curing a dielectric film on a semiconductor wafer, comprising the steps of:

provid ing a semiconductor wafer with a dielectric layer thereon;

placing said semiconductor wafer in an curing oven at a first temperature;

providing a flow of an inert gas into said curing oven at a flow rate of about 30 standard liters per minute;

ramping up the temperature within said curing oven to a second temperature;

maintaining the temperature within said curing oven at the second temperature for a period of time;

ramping down the temperature within said curing oven to a third temperature; and removing said wafer from said oven.

20. A method for curing a dielectric film on a semiconductor wafer, comprising the steps of:

placing a semiconductor wafer in an curing oven at a first temperature in the range of about 225° C. to about 350° C.; and ramping up the temperature within said curing oven to a second temperature.

21. A method for curing a dielectric film on a semiconductor wafer, comprising the steps of:

placing said semiconductor wafer in an curing oven at a first temperature; and providing a flow of an inert gas into said curing oven at a flow rate between about 5 slpm and about 50 slpm.

22. The method of claim 20, further comprising the step of:

providing a flow of an inert gas into said curing oven at a flow rate between about 5 slpm and about 50 slpm.

\* \* \* \* \*